United States Patent
Lin et al.

(10) Patent No.: US 11,901,217 B2
(45) Date of Patent: Feb. 13, 2024

(54) METHOD AND APPARATUS FOR MAKING SHALLOW TRENCH STRUCTURE

(71) Applicant: NEXCHIP SEMICONDUCTOR CORPORATION, Anhui (CN)

(72) Inventors: Tzujen Lin, Anhui (CN); Chihchiang Yang, Anhui (CN); Chengwei Lin, Anhui (CN); Yucheng Lin, Anhui (CN)

(73) Assignee: NEXCHIP SEMICONDUCTOR CORPORATION, Hefei (CN)

( * ) Notice: Subject to any disclaimer, the term of this patent is extended or adjusted under 35 U.S.C. 154(b) by 371 days.

(21) Appl. No.: 17/246,588

(22) Filed: Apr. 30, 2021

(65) Prior Publication Data

US 2022/0093450 A1    Mar. 24, 2022

(30) Foreign Application Priority Data

Sep. 24, 2020 (CN) .......................... 202011012959.9

(51) Int. Cl.
  *H01L 21/762* (2006.01)
  *H01L 21/3213* (2006.01)
  *H01L 21/311* (2006.01)

(52) U.S. Cl.
  CPC .. *H01L 21/76224* (2013.01); *H01L 21/31111* (2013.01); *H01L 21/31116* (2013.01); *H01L 21/32137* (2013.01)

(58) Field of Classification Search
  CPC ......... H01L 21/76232; H01L 21/31116; H01L 21/76224; H01L 21/31111; H01L 21/32137
  USPC .................................. 438/424, 432; 257/506
  See application file for complete search history.

(56) References Cited

U.S. PATENT DOCUMENTS

| | | | |
|---|---|---|---|
| 2008/0081434 A1* | 4/2008 | Nam et al. | ........ H01L 21/76224 438/482 |
| 2016/0049498 A1* | 2/2016 | Cheng et al. | ..... H01L 29/66636 |

* cited by examiner

*Primary Examiner* — Thinh T Nguyen

(57) ABSTRACT

The present disclosure provides a method for making a shallow trench structure, which at least includes the following: preparing a substrate; forming a first material layer on one side of the substrate; forming a second material layer on the first material layer; forming a shallow trench in the second material layer, the first material layer and the substrate; performing a first lateral etching on the second material layer from the shallow trench to both sides by using wet etching; performing a second lateral etching on the first material layer from the shallow trench to both sides by using dry etching. The present disclosure solves the problem of the damage to the silicon in the shallow trench caused by the traditional lateral etching technology.

12 Claims, 4 Drawing Sheets

METHOD AND APPARATUS FOR MAKING SHALLOW TRENCH STRUCTURE

BACKGROUND

Field of Disclosure

The present disclosure belongs to the technical field of integrated circuit fabrication, and particularly relates to a method and apparatus for making a shallow trench structure.

Description of Related Arts

Semiconductor integrated circuits generally include active regions and isolation regions between the active regions, and these isolation regions have been formed before the active devices are manufactured. As the semiconductor technology enters the deep sub-micron era, the active area isolation layer of semiconductor devices has been mostly manufactured by shallow trench isolation (STI) technology.

With the evolution and progress of semiconductor technology nodes and semiconductor manufacturing machines, the density of devices on the substrate continues to increase, and key dimensions continue to shrink. To facilitate the filling of the shallow trench isolation structure, the mask layer on the substrate needs to be etched back, that is, laterally etched. The traditional mask layer lateral etching technology relies on reagents to perform wet etching throughout the entire process, and these methods will cause a certain degree of damage to the substrate in the shallow trench when etching the mask layer.

SUMMARY

The present disclosure provides a method and apparatus for making a shallow trench structure, which solves the problem of the damage to the substrate in the shallow trench caused by the traditional lateral etching technology.

The present disclosure provides a method for making a shallow trench structure, which at least includes the following:

preparing a substrate;

forming a first material layer on one side of the substrate;

forming a second material layer on the first material layer;

forming a shallow trench in the second material layer, the first material layer and the substrate;

performing a first lateral etching on the second material layer from the shallow trench to both sides by using wet etching;

performing a second lateral etching on the first material layer from the shallow trench to both sides by using dry etching, such that the lateral wall of the first material layer is aligned with the lateral wall of the second material layer.

In an embodiment of the present disclosure, the first material layer includes silicon nitride.

In an embodiment of the present disclosure, the second material layer includes silicon oxide.

In an embodiment of the present disclosure, the width of the first lateral etching is 20 Å to 200 Å.

In an embodiment of the present disclosure, the contact corner between the substrate and the shallow trench is an arc-shaped corner.

In an embodiment of the present disclosure, the radian of the arc-shaped corner is less than $0.5\pi$.

In an embodiment of the present disclosure, the lateral wall of the first material layer is aligned with the lateral wall of the second material layer.

In an embodiment of the present disclosure, the gas for dry etching includes a fluorine-containing gas.

In an embodiment of the present disclosure, the dry etching gas is a mixed gas of difluoromethane, trifluoromethane and helium.

In an embodiment of the present disclosure, the width of the second lateral etching is 20 Å to 200 Å.

In an embodiment of the present disclosure, the lateral wall of the first material layer is not aligned with the lateral wall of the second material layer.

The present disclosure further provides an apparatus for making a shallow trench structure. The shallow trench is formed in the substrate. A first material layer and a second material layer are provided in an area except the shallow trench opening in the substrate. The apparatus includes:

a plurality of liquid inlet pipes, vertically provided in the shallow trench;

a plurality of liquid ejection heads, each of the liquid ejection heads is connected with each of the liquid inlet pipes, and the liquid ejection heads face a lateral wall of the second material layer close to the shallow trench;

a plurality of first lateral etching channels, one end of each of the first lateral etching channels is vertically connected to each of the liquid inlet pipes; the other end of each of the first lateral etching channels is in contact with a lateral wall of the second material layer close to the shallow trench; the shape and size of the cross section of each of the first lateral etching channels match the shape and size of a lateral wall of the second material layer close to the shallow trench; each of the first lateral etching channels covers the exterior of each of the liquid ejection heads; the wet etching reagent flows through the first lateral etching channels to perform a first lateral etching on the lateral wall of the second material layer;

a plurality of intake pipes, vertically provided in the shallow trench;

a plurality of jet heads, each of the jet heads is connected with each of the intake pipes, and the jet heads face a lateral wall of the first material layer close to the shallow trench;

a plurality of second lateral etching channels, one end of each of the second lateral etching channels is vertically connected to each of the intake pipes; the other end of each of the second lateral etching channels is in contact with a lateral wall of the first material layer close to the shallow trench; the shape and size of the cross section of each of the second lateral etching channels match the shape and size of a lateral wall of the first material layer close to the shallow trench; each of the second lateral etching channels covers the exterior of each of the jet heads; the dry etching gas flows through the second lateral etching channels to perform a second lateral etching on the lateral wall of the first material layer;

In an embodiment of the present disclosure, the apparatus further includes a plurality of first heaters and a plurality of second heaters. Each of the first heaters is provided on the outer wall of each of the first lateral etching channel. Each of the second heaters is provided on the outer wall of each of the second lateral etching channel.

In the method and apparatus for making a shallow trench structure of the present disclosure, the mask layer is laterally etched by the method combining wet etching and dry etching. The problem of the damage to the substrate in the shallow trench, which is caused by the wet etching relying on reagents throughout the entire process of the traditional mask layer lateral etching technology, is avoided. The dry etching may be implemented by using traditional dry etching machines, which can save the cost of evaluating new machines due to wet etching making acid. The method for preparing a shallow trench structure according to the present disclosure is suitable for 28-90 nanometer integrated circuit manufacturing processes.

Of course, any product implementing the present disclosure does not necessarily need to achieve all the advantages described above at the same time.

BRIEF DESCRIPTION OF THE DRAWINGS

To better illustrate the technical solutions of the embodiments of the present disclosure, the following will briefly introduce the drawings required for embodiment description. Obviously, the drawings in the following description are merely some embodiments of the present disclosure. For those of ordinary skill in the art, other drawings may be obtained based on these drawings without creative efforts.

DETAILED DESCRIPTION OF THE PREFERRED EMBODIMENTS

The technical solutions in the embodiments of the present disclosure will be described clearly and completely below with reference to the drawings. The described embodiments are only a part of the embodiments of the present disclosure, instead of all embodiments of the present disclosure. All other embodiments that persons of ordinary skill in the art obtain without creative efforts based on the embodiments of the present disclosure also fall within the scope of the present disclosure.

With the evolution and progress of semiconductor technology nodes and semiconductor manufacturing machines, the density of devices on silicon wafers continues to increase, and the key dimension continues to shrink. The method for making a shallow trench structure according to the present disclosure is suitable for 28-90 nanometer integrated circuit manufacturing processes. In the present disclosure, to facilitate the filling of the shallow trench isolation structure, the mask layer on the substrate needs to be etched back, that is, laterally etched. The traditional mask layer lateral etching technology relies on reagents to perform wet etching throughout the entire process, and these methods will cause a certain degree of damage to the substrate in the shallow trench when etching the mask layer.

Figure 1:
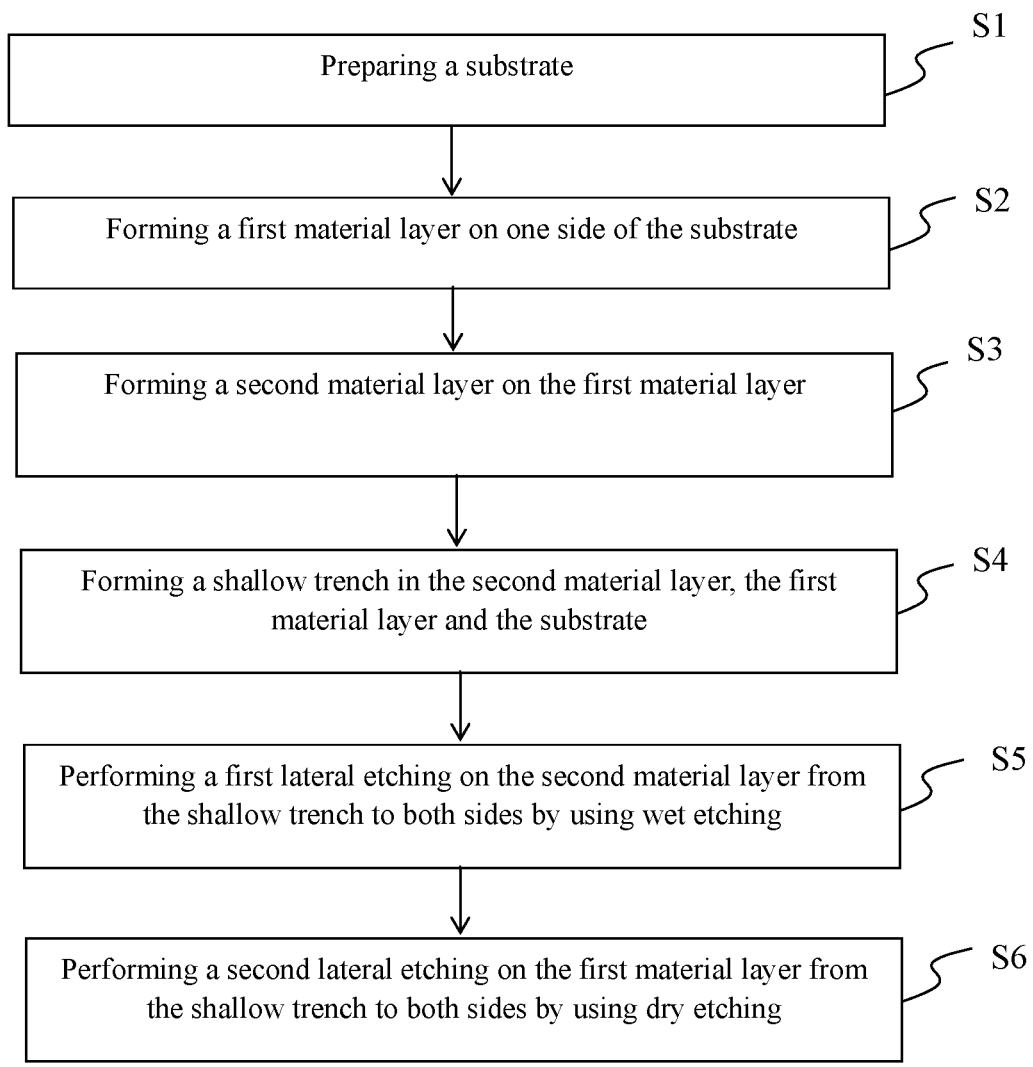
FIG. 1 shows a flowchart of a method for making a shallow trench structure according to the present disclosure.

Referring to FIG. 1, the present disclosure provides a method for making a shallow trench structure, which at least includes the following:

S1, preparing a substrate 1;

S2, forming a first material layer 2 on one side of the substrate 1;

S3, forming a second material layer 3 on the first material layer 2;

S4, forming a shallow trench 4 in the second material layer 3, the first material layer 2 and the substrate 1;

S5, performing a first lateral etching on the second material layer 3 from the shallow trench 4 to both sides by using wet etching;

S6, performing a second lateral etching on the first material layer 2 from the shallow trench 4 to both sides by using dry etching.

Figure 2:
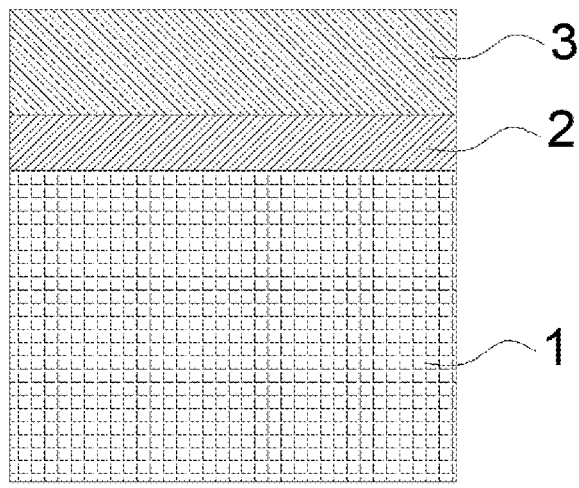
FIG. 2 is a structural diagram corresponding to steps S1 to S3 in FIG. 1.

Referring to FIG. 2, in step S1, the substrate 1 may include, but is not limited to, monocrystalline or polycrystalline semiconductor material, and the substrate 1 may further include an intrinsic monocrystalline silicon substrate 1 or a doped silicon substrate 1. The substrate 1 includes a substrate 1 of a first doping type. The first doping type may be P-type or N-type. In this embodiment, as an example, the first doping type is P-type. That is, in this embodiment, the substrate 1 is a P-type substrate 1 as an example, such as a P-type silicon substrate 1. In some embodiments, the substrate 1 may be a monocrystalline silicon substrate 1, a Ge substrate 1, a SiGe substrate 1, a silicon-on-insulator (SOI) or any combination thereof. A suitable semiconductor material may be selected as the substrate 1 according to the actual requirements of the device, which is not limited here. In some embodiments, the substrate 1 may be composed of a compound semiconductor material, such as a group III-V semiconductor material or a group II-VI semiconductor material.

Referring to FIG. 2, in step S2, a first material layer 2 is formed on one side of the substrate 1. The first material layer 2 may be, for example, silicon oxide or silicon oxynitride. During preparation, for example, the first material layer 2 made of silicon oxide may be formed by furnace oxidation, rapid thermal annealing oxidation, in-situ steam oxidation or other thermal oxidation methods. The first material layer 2 made of silicon oxynitride may be formed by performing a nitridation process on silicon oxide, and the nitridation process may be high temperature furnace nitridation, rapid thermal annealing nitridation, plasma nitridation or other nitridation processes. In other embodiments, during preparation, the first material layer 2 may be formed by chemical vapor deposition technology.

Referring to FIG. 2, in step S3, a second material layer 3 is formed on the first material layer 2. The second material layer 3 serves as a barrier layer to protect the active area in the subsequent etching process. The function of the first material layer 2 is to reduce the stress between the substrate 1 and the second material layer 3. In this embodiment, the material of the second material layer 3 may be, for example, silicon nitride. During preparation, the second material layer 3 may be formed by chemical vapor deposition technology. The chemical vapor deposition technology here may be a low pressure chemical vapor deposition method or a plasma enhanced chemical vapor deposition method.

Figure 4:
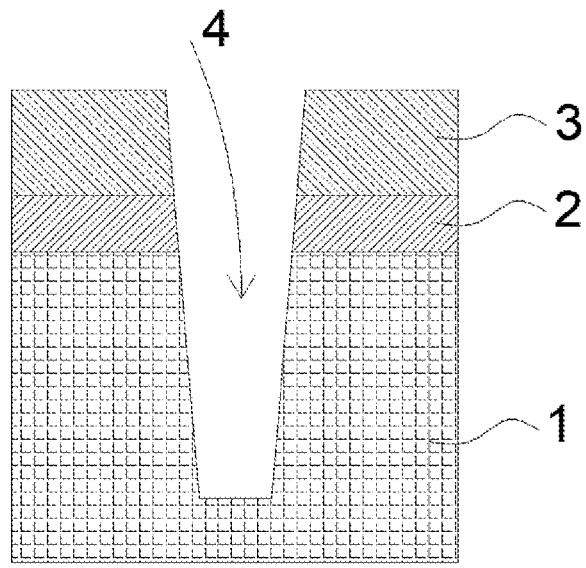

Referring to FIG. 4, in step S4, a shallow trench 4 is formed in the second material layer 3, the first material layer 2 and the substrate 1. In some embodiments, a plurality of shallow trenches 4 may be formed on the substrate 1, thereby forming a plurality of isolation structures. The plurality of isolation structures divide the substrate 1 into a plurality of regions, and the plurality of regions may be distributed in parallel at intervals, or arranged according to the semiconductor structure. In this embodiment, the area of the substrate 1 between adjacent isolation structures constitutes a high-voltage device area or a low-voltage device area.

Figure 3:
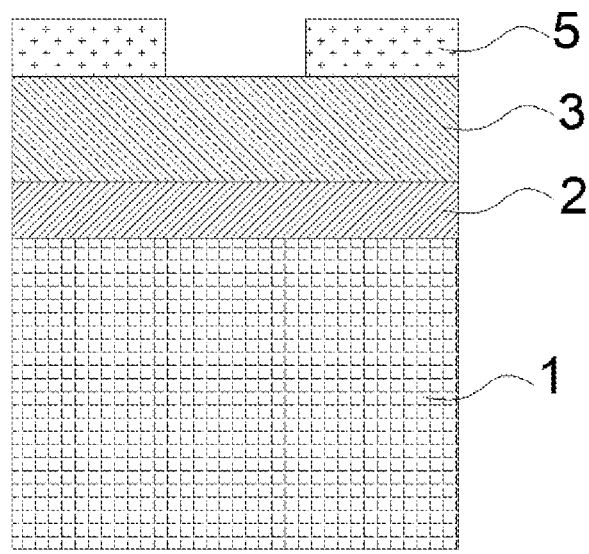
FIGS. 3 and 4 are structural diagrams corresponding to steps S4 in FIG. 1.

Referring to FIGS. 3 and 4, in step S4, in this embodiment, the forming of the shallow trench 4 specifically includes: forming a first patterned photoresist layer 5 on the second material layer 3. The first patterned photoresist layer 5 exposes a part of the second material layer 3, and defines the position of the shallow trench 4. In this embodiment, the etching may be, for example, a reactive ion etching or plasma etching. That is, the second material layer 3 and the first material layer 2 are sequentially etched through the reactive ion etching or plasma etching process to expose the surface material of the substrate 1. Then, the fluorine-containing etching gas is used to etch the substrate 1 with the second material layer 3 and the first material layer 2 as masks, thereby forming a shallow trench 4 extending into the substrate 1. The depth of the shallow trench 4 is, for example, 2500 Å to 3500 Å.

Referring to FIGS. 3 and 4, in step S4, in some embodiments, a photoresist layer may be formed on the second material layer 3 by, for example, a spin coating method. After exposure and development processes, an opening is formed on the photoresist layer to obtain a first patterned photoresist layer 5. Using the first patterned photoresist layer 5 as a mask, the second material layer 3 and the first material layer 2 under the opening pattern are removed until the substrate 1 is exposed. The photoresist layer may be removed by an ashing method. Then, by using the second material layer 3 and the first material layer 2 as masks, the substrate 1 is etched by a dry etching method to form the shallow trench 4. The shallow trench 4 penetrates the first material layer 2 and the second material layer 3 and extends into the substrate 1. The shallow trench 4 area will form an isolation structure in the subsequent preparation process. One end of the isolation structure extends into the substrate 1. The substrate 1 covered by the second material layer 3 and the first material layer 2 serves as an active area for forming semiconductor devices.

Figure 5:
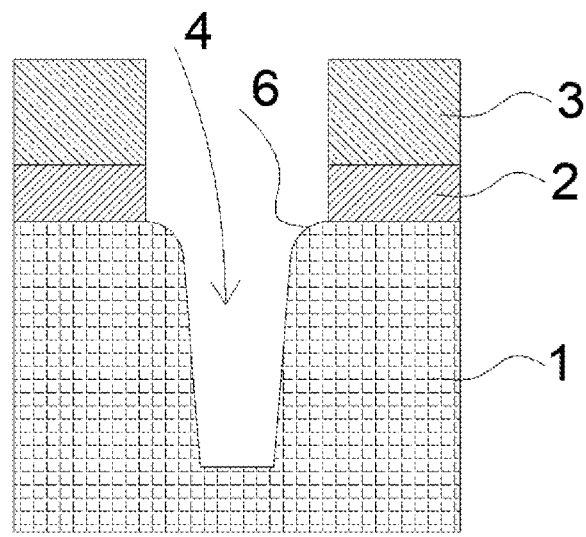
FIG. 5 is a structural diagram corresponding to steps S5 and S6 in FIG. 1.

Referring to FIG. 5, in step S5, a first lateral etching from the shallow trench 4 to both sides is performed on the second material layer 3 by using wet etching. Specifically, the wet etching reagent is, for example, phosphoric acid, and the width of the first lateral etching is 20 Å to 200 Å.

Referring to FIG. 5, in step S6, a second lateral etching from the shallow trench 4 to both sides is performed on the first material layer 2 by using dry etching. The width of the second lateral etching is 20 Å to 200 Å. In some embodiments, the lateral wall of the first material layer 2 may be aligned with the lateral wall of the second material layer 3. In some embodiments, the lateral wall of the first material layer 2 may not be aligned with the lateral wall of the second material layer 3.

The dry etching is, for example, a plasma etching method. Since the plasma etching of the first material layer 2, such as silicon oxide, may use a gas containing fluorocarbon for etching, the etching gas used may be one or more of carbon tetrafluoride (CF4), octafluoropropane, difluoromethane or trifluoromethane. In this embodiment, a mixed gas of difluoromethane and trifluoromethane serves as an example of the etching gas. The reaction rate of fluorine atom with silicon is very fast, for example, 10-1000 times that of silicon oxide. Therefore, a high etching selectivity ratio of silicon oxide to silicon is obtained. It can be considered that in the fluorocarbon gas, the higher the ratio of fluorine atoms, the more polymers are formed, which will result in a high etching selectivity ratio. In some embodiments, a silicon source, such as silicon tetrafluoride, may be added to increase fluorine atoms, so as to change the fluorine-carbon atomic ratio, thereby increasing the etching selectivity ratio of silicon oxide to silicon. In some embodiments, oxygen may be added to the reaction gas. The oxygen concentration is, for example, 20%-40%. Oxygen will react with the fluorocarbon to release fluorine atoms while consuming part of the carbon, thereby changing the fluorine-carbon atom ratio, thereby improving the etching selectivity ratio of silicon oxide to silicon. However, when the oxygen concentration is greater than 40%, the etching selectivity ratio decreases. In some embodiments, helium may be added to the etching gas to reduce the etching rate of silicon. When the concentration of helium gas is, for example, 40%, the etching rate of silicon is approximately equal to 0, which can be regarded as only silicon oxide is etched, and silicon not etched, thereby protecting the silicon substrate 1 in the shallow trench 4 from damage. Specifically, in this embodiment, the etching gas parameters are, for example, CHF3:CH2F2:He=100:30:40. The etching rate for silicon oxide is, for example, 500 Å/min. The etching selectivity ratio of silicon oxide to silicon substrate 1 is, for example, greater than 10. Under the action of dry etching, the contact corner between the substrate 1 and the shallow trench 4 is an arc-shaped corner 6. The radian of the arc-shaped corner 6 is less than 0.5π, which avoids the shallow trench structure from being concave.

Figure 6:
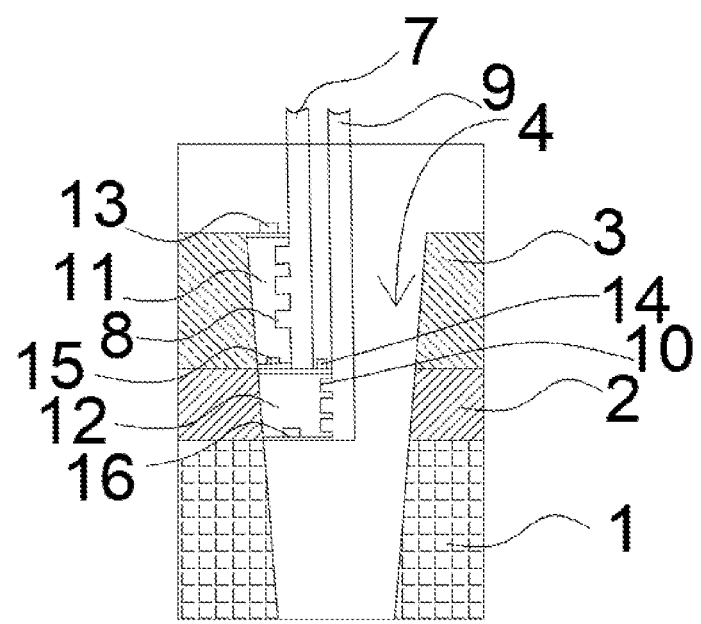
FIG. 6 shows a structural diagram of an apparatus for making a shallow trench structure according to the present disclosure.

Referring to FIG. 6, the present disclosure further provides an apparatus for making a shallow trench structure 4, which includes: a plurality of liquid inlet pipes 7, a plurality of liquid ejection heads 8, a plurality of intake pipes 9, a plurality of jet heads 10, a plurality of first lateral etching channels 11, a plurality of second lateral etching channels 12, a plurality of first heaters 13, a plurality of second heaters 14, a plurality of first temperature sensors 15, and a plurality of second temperature sensors 16.

Referring to FIG. 6, the plurality of liquid inlet pipes 7 may be erected side by side in the shallow trench 4. One end of each liquid inlet pipe 7 is, for example, leveled with the interface between the first material layer 2 and the second material layer 3. The plurality of liquid ejection heads 8 is connected to one end of each liquid inlet pipe 7 and faces the position of the second material layer 3. One end of each first lateral etching channel 11 is vertically connected to each of the liquid inlet pipes 7 and covers the exterior of the plurality of liquid ejection heads 8. The other end of the first lateral etching channel 11 is in contact with a lateral wall of the second material layer 3. The cross-sectional shape and size of the first lateral etching channel 11 matches the shape and size of the side surface of the second material layer 3. That is, the first lateral etching channel 11 is aligned with the side surface of the second material layer 3. The reagent used for wet etching is fed from the liquid inlet pipe 7 and ejected from the liquid ejection head 8, and acts on the lateral wall of the second material layer 3 through the first lateral etching channel 11, so as to realize the lateral etching of the second material layer 3. In some embodiments, a first heater 13 may be provided on the outer wall of the first lateral etching channel 11. The heating effect of the first heater 13 increases the temperature of the etching reagent flowing in the first lateral etching channel 11, thereby increasing the etching speed. In some embodiments, a first temperature sensor 15 may be further provided on the inner wall of the first lateral etching channel 11. The first temperature sensor 15 is connected with the first heater 13, and the temperature of the etching reagent in the first lateral etching channel 11 is monitored by the first temperature sensor 15. When the temperature of the etching reagent exceeds a threshold value, the first heater 13 stops heating, so as to avoid affecting the etching quality due to the excessively fast etching speed.

Referring to FIG. 6, the plurality of intake pipes 9 may be erected side by side in the shallow trench 4. One end of each intake pipe 9 is, for example, leveled with the interface between the first material layer 2 and substrate 1. The plurality of jet heads 10 is connected to one end of each intake pipe 9 and faces the position of the first material layer 2. One end of each second lateral etching channel 12 is vertically connected to each of the intake pipes 9 and covers the exterior of the plurality of jet heads 10. The other end of the second lateral etching channel 12 is in contact with a lateral wall of the first material layer 2. The cross-sectional shape and size of the second lateral etching channel 12 matches the shape and size of the side surface of the first material layer 2. That is, the second lateral etching channel 12 is aligned with the side surface of the first material layer 2. The gas used for dry etching is fed from the intake pipe 9 and ejected from the jet head 10, and acts on the lateral wall of the first material layer 2 through the second lateral etching channel 12, so as to realize the lateral etching of the first material layer 2 until the side surfaces of the first material layer 2 and the second material layer 3 are aligned. In some embodiments, a second heater 14 may be provided on the outer wall of the second lateral etching channel 12. The heating effect of the second heater 14 increases the temperature of the etching gas passing through the second lateral etching channel 12, thereby increasing the etching speed. In some embodiments, a second temperature sensor 16 may be further provided on the inner wall of the second lateral etching channel 12. The second temperature sensor 16 is connected with the second heater 14, and the temperature of the etching gas in the second lateral etching channel 12 is monitored by the second temperature sensor 16. When the temperature of the etching gas exceeds a threshold value, the second heater 14 stops heating, so as to avoid affecting the etching quality due to the excessively fast etching speed.

Referring to FIG. 6, in some embodiments, the liquid inlet pipe 7 and the intake pipe 9 may also be rotated, driving the liquid ejection head 8, the jet head 10, the first lateral etching channel 11 and the second lateral etching channel 12 to rotate together, for example, by 180°. After the first material layer 2 and the second material layer 3 on one side of the shallow trench 4 are etched laterally, the liquid inlet pipe 7 and the intake pipe 9 rotate to the other side for laterally etching the first material layer 2 and the second material layer on the other side of the shallow trench 4.

Referring to FIGS. 1 and 6, the apparatus for making the shallow trench structure 4 according to the present disclosure can realize wet etching and dry etching simultaneously. Combining with the method for making the shallow trench structure 4 according to the present disclosure, a shallow trench structure 4 can be obtained conveniently without damaging the substrate 1.

In this specification, the description with reference to the terms "one embodiment", "example", "specific example", etc., means that a specific feature, structure, material, or characteristic described in combination with the embodiment or example is included in at least one embodiment or example of the present disclosure. In this specification, schematic representations of the above terms do not necessarily refer to the same embodiment or example. Moreover, the described features, structures, materials, or characteristics may be combined in any suitable manner in one or more embodiments or examples.

The above preferred embodiments of the present disclosure are merely described to help clarify the present disclosure. The preferred embodiments are not exhaustive of all the details of the present disclosure, nor does it limit the present disclosure to only the described specific embodiments. Obviously, various modifications and changes may be made according to the content of this specification. The embodiments are chosen and described in detail in order to better explain the principles of the present disclosure and its practical applications, and to thereby enable the skilled in the art to understand and utilize the present disclosure. The present disclosure is only limited by the claims and the full scope and equivalents thereof.

What is claimed is:

1. A method for making a shallow trench structure, which at least comprises the following:
   preparing a substrate;
   forming a first material layer on one side of the substrate;
   forming a second material layer on the first material layer;
   forming a shallow trench, wherein the shallow trench penetrates the second material layer and the first material layer and extends into the substrate;
   performing a first lateral etching on the second material layer from the shallow trench to both sides by using wet etching;
   performing a second lateral etching on the first material layer from the shallow trench to both sides by using dry etching.

2. The method for making a shallow trench structure according to claim 1, wherein the first material layer comprises silicon nitride.

3. The method for making a shallow trench structure according to claim 1, wherein the second material layer comprises silicon oxide.

4. The method for making a shallow trench structure according to claim 1, wherein a width of the first lateral etching is 20 Å to 200 Å.

5. The method for making a shallow trench structure according to claim 1, wherein a contact corner between the substrate and the shallow trench is an arc-shaped corner.

6. The method for making a shallow trench structure according to claim 1, wherein a radian of the arc-shaped corner is less than $0.5\pi$.

7. The method for making a shallow trench structure according to claim 1, wherein a lateral wall of the first material layer is not aligned with a lateral wall of the second material layer.

8. The method for making a shallow trench structure according to claim 1, wherein a gas for the dry etching is a fluorine-containing gas.

9. The method for making a shallow trench structure according to claim 1, wherein a width of the second lateral etching is 20 Å to 200 Å.

10. The method for making a shallow trench structure according to claim 1, wherein a lateral wall of the first material layer is aligned with a lateral wall of the second material layer.

11. The method for making a shallow trench structure according to claim 1, wherein the forming of the shallow trench comprises: forming a first patterned photoresist layer on the second material layer.

12. The method for making a shallow trench structure according to claim 1, wherein the first lateral etching and the second lateral etching are performed by an apparatus for making a shallow trench structure, wherein the apparatus comprises:
   a plurality of liquid inlet pipes, vertically provided in the shallow trench;
   a plurality of liquid ejection heads, each of the liquid ejection heads is connected with each of the liquid inlet pipes, and the liquid ejection heads face a lateral wall of the second material layer close to the shallow trench;
   a plurality of first lateral etching channels, one end of each of the first lateral etching channels is vertically connected to each of the liquid inlet pipes; the other end of each of the first lateral etching channels is in contact with a lateral wall of the second material layer close to the shallow trench; the shape and size of the cross section of each of the first lateral etching channels match the shape and size of a lateral wall of the second material layer close to the shallow trench; each of the first lateral etching channels covers the exterior of each of the liquid ejection heads; the wet etching reagent flows through the first lateral etching channels to perform a first lateral etching on the lateral wall of the second material layer;

a plurality of intake pipes, vertically provided in the shallow trench;

a plurality of jet heads, each of the jet heads is connected with each of the intake pipes, and the jet heads face a lateral wall of the first material layer close to the shallow trench; and a plurality of second lateral etching channels, one end of each of the second lateral etching channels is vertically connected to each of the intake pipes; the other end of each of the second lateral etching channels is in contact with a lateral wall of the first material layer close to the shallow trench; the shape and size of the cross section of each of the second lateral etching channels match the shape and size of a lateral wall of the first material layer close to the shallow trench; each of the second lateral etching channels covers the exterior of each of the jet heads; the dry etching gas flows through the second lateral etching channels to perform a second lateral etching on the lateral wall of the first material layer.

* * * * *